(12) United States Patent
Yamamoto et al.

(10) Patent No.: US 8,258,490 B2
(45) Date of Patent: Sep. 4, 2012

(54) ULTRAVIOLET IRRADIATION DEVICE (75) Inventors: Masayuki Yamamoto, Ibaraki (JP);
Masaru Irie, Kameyama (JP)

(73) Assignee: Nitto Denko Corporation, Osaka (JP)

( * ) Notice: Subject to any disclaimer, the term of this patent is extended or adjusted under 35 U.S.C. 154(b) by 212 days.

(21) Appl. No.: 12/768,645

(22) Filed: Apr. 27, 2010

(65) Prior Publication Data

US 2010/0301233 A1  Dec. 2, 2010

(30) Foreign Application Priority Data

May 26, 2009  (JP) ................. 2009-126651

(51) Int. Cl.
*G21G 5/00* (2006.01)
(52) U.S. Cl. .......... 250/492.1; 250/492.2; 250/492.22; 250/453.11; 250/454.11; 250/455.11
(58) Field of Classification Search .............. 250/492.1, 250/492.2, 492.22, 453.11–455.11
See application file for complete search history.

(56) References Cited

U.S. PATENT DOCUMENTS

2007/0227670 A1* 10/2007 Kobayashi et al. ........ 156/379.6
2008/0023639 A1*  1/2008 Kawasaki et al. ............ 250/372
2009/0029063 A1*  1/2009 Kokaji et al. ................ 427/532

FOREIGN PATENT DOCUMENTS

JP           5-63077 A    3/1993
JP        2006-40944 A    2/2006

* cited by examiner

*Primary Examiner* — Michael Maskell
(74) *Attorney, Agent, or Firm* — Cheng Law Group, PLLC (57) ABSTRACT

Prior to applying of ultraviolet rays to a surface of a wafer with a protective tape joined thereto that is placed and held on a holding table, an illumination sensor moves to a position below an ultraviolet irradiation unit having ultraviolet light emitting diodes arranged in one dimensional array to measure ultraviolet intensity in a position corresponding to a surface of the protective tape, and output voltage of each diode is controlled so as to maintain a uniform accumulated quantity of light in an area of the protective tape where ultraviolet rays are applied that is determined from the result of measurement and a turning velocity of the holding table.

11 Claims, 9 Drawing Sheets

ULTRAVIOLET IRRADIATION DEVICE

BACKGROUND OF THE INVENTION

1. Field of the Invention

This invention relates to an ultraviolet irradiation device to irradiate an ultraviolet curable protective tape joined to a surface of the semiconductor wafer with ultraviolet rays for reducing adhesive force thereof prior to separation of the protective tape.

2. Description of the Related Art

Examples of methods for use in thinning a semiconductor wafer (hereinafter, simply referred to as a "wafer") include a mechanical method such as grinding and polishing or a chemical method such as etching. These methods are used for processing a rear face of the wafer to obtain a thinner thickness thereof. Upon processing the wafer through these methods, the protective tape is joined to a surface of the wafer for protection with a wiring pattern formed thereon. The rear face of the ground wafer with the protective tape joined thereto is adhesively held on a ring frame via a support adhesive tape. Subsequently, the protective tape is separated from the surface of the wafer held on the ring frame.

The following method is known for separating a protective tape. That is, a separation tape having strong adhesive force is joined to a surface of a protective tape, and then the separation tape is separated. Consequently, the protective tape may be separated from a surface of a wafer together with the separation tape. See JPH05-63077A.

Moreover, an ultraviolet curable protective tape is used, and ultraviolet rays are applied to the protective tape prior to separation thereof, thereby obtaining the protective tape having reduced adhesive force. A device for irradiating the protective tape with ultraviolet rays is configured as following. That is, a wafer with the protective tape joined thereto is suction-held on a suction table capable of reciprocating along a guide rail. The ultraviolet irradiation device arranged in an upper side irradiates the protective tape with ultraviolet rays during reciprocation of the suction table. The ultraviolet irradiation device has ultraviolet light emitting diodes (hereinafter, appropriately referred to as "diodes") arranged in rows and columns. See JP2006-40944A.

The above conventional device, however, has the following problems.

Specifically, the ultraviolet irradiation device need to reciprocate the suction table on the guide rail, which may result in an enlarged area for installation of the device.

In addition, uniform intensity of illumination throughout the surface of the wafer during in-line reciprocation on the guide rail requires diodes arranged in rows and columns beyond a diameter of the wafer. As a result, another problem may arise that the device increases in size and weight.

SUMMARY OF THE INVENTION

This invention provides an ultraviolet irradiation device having a reduced size that is incorporable into a conventional protective tape separation device and therefore has a simple construction.

Additional features of the invention will be set forth in the description which follows, and in part will be apparent from the description, or may be learned by practice of the invention.

This invention discloses an ultraviolet irradiation device for irradiating with ultraviolet rays an ultraviolet curable protective tape joined to a surface of a semiconductor wafer. The ultraviolet irradiation device includes a holding table to mount and hold the semiconductor wafer with the protective tape joined thereto, a drive mechanism to turn the holding table, ultraviolet light emitting diodes arranged at least in a radial direction of the semiconductor wafer, and a control unit to maintain a uniform accumulated quantity of light in an area of the protective tape where ultraviolet rays are applied.

According to the ultraviolet irradiation device of this embodiment, the diodes are arranged at least in the radial direction of the wafer. For instance, the diodes may be arranged in a line, and the holding table may turn, thereby obtaining a uniform accumulated quantity of ultraviolet light over the entire surface of the protective tape joined to the surface of the wafer. That is, there is no need for the holding table to reciprocate along a guide rail. Moreover, the diodes need not to be arranged in row and columns beyond a diameter of the wafer. Consequently, the device may be reduced in size.

When the holding table turns, a peripheral velocity increases outwardly along the diameter from a center of the semiconductor wafer. Thus, the above device preferably has the following configuration so as to maintain the uniform accumulated quantity of ultraviolet light over the entire surface of the protective tape.

Supply voltage may be controlled such that intensity of the ultraviolet rays from the diodes increases outwardly from the center of the semiconductor wafer.

The device may be configured such that a distance from the surface of the protective tape to the diodes decreases outwardly from the center of the semiconductor wafer. With this configuration, illumination of the ultraviolet rays increases in an outer portion at which a level of the diode is lower than that at the center of the wafer and thus has a smaller distance to the surface of the protective tape. Therefore, the intensity of the ultraviolet rays also increases.

The device preferably includes the following configuration for setting each level of the diodes. That is, the device further includes a sensor to measure intensity of ultraviolet rays from the diodes, a lifting mechanism to change each level of the diodes, and a level controller to control each level of the diodes based on detected result of the sensor through operation of the lifting mechanism so as to maintain a uniform accumulated quantity of light per area on the surface of the protective tape.

With this configuration, the accumulated quantity of ultraviolet light per area on the surface of the protective tape may be controlled with higher accuracy based on illumination determined by the sensor.

Consequently, the protective tape may be irradiated with the ultraviolet rays constantly in a stable condition regardless of environmental variations upon irradiation of the ultraviolet rays.

For maintaining a constant accumulated quantity of ultraviolet light over the entire surface of the protective tape, the diodes may be arranged so that spaces therebetween may be smaller outwardly of the semiconductor wafer.

With this configuration, the spaces between the diodes may be smaller toward an outer periphery the semiconductor wafer, and thus spots of the ultraviolet rays from adjacent diodes are to overlap each other. Consequently, an outer periphery side with faster peripheral velocity than a center side of the semiconductor wafer has stronger intensity of the ultraviolet rays per area than the center side thereof, which realizes a uniform accumulated quantity of light over the entire surface of the protective tape.

In another aspect, the device may further have a lighting control unit to control the diodes so as to perform intermittent lighting separately such that a lighting duration of each diode may extend outwardly of the semiconductor wafer.

In each configuration, the device may further have a screen having a slit formed therein that fans outwardly from the center of the semiconductor wafer such that the surface of the protective tape may be irradiated with the ultraviolet rays from the diodes through the slit of the screen.

With this configuration, the ultraviolet rays that spread radically may pass through the slit of the screen, and thus the protective tape may be irradiated with only a component of the ultraviolet rays having high intensity. Consequently, a uniform accumulated quantity of ultraviolet light may be realized over the entire surface of the protective tape.

The device may further have a filter with increasing ultraviolet transmittance outwardly of the semiconductor wafer such that the surface of the protective tape may be irradiated with the ultraviolet rays from the diodes through the filter.

This configuration may also realize a uniform accumulated quantity of ultraviolet light over the entire surface of the protective tape.

In each configuration, the device preferably has an auxiliary ultraviolet light emitting diode to irradiate a peripheral edge of the protective tape.

The adhesive of the ultraviolet curable protective tape may possibly protrude beyond the peripheral edge of the wafer upon joining of the protective tape to the wafer. When the adhesive is cured using conventional devices, irradiation with ultraviolet rays is performed while nitrogen is purged into a chamber for removal of oxygen as a factor that prevents curing. Here, the adhesive is to be directly irradiated with ultraviolet rays having high intensity. Thus, it has been found through this configuration that the adhesive may be cured with no nitrogen purged.

With this configuration, an edge of the wafer may be irradiated with the ultraviolet rays having higher intensity than that applied on the entire surface of the protective tape. That is, all the adhesives may be cured to an approximately identical extent, and adhesive force thereof may be reduced. Consequently, elimination may be realized of damages on the wafer due to an uncured adhesive on the wafer edge and residues of the adhesive on the wafer edge when the protective tape is to be separated in a subsequent process.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DESCRIPTION OF THE PREFERRED EMBODIMENTS

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

One exemplary embodiment of a semiconductor wafer mounting apparatus including an ultraviolet irradiation device of this invention will be described in detail hereinafter with reference to the drawings.

Figure 1:
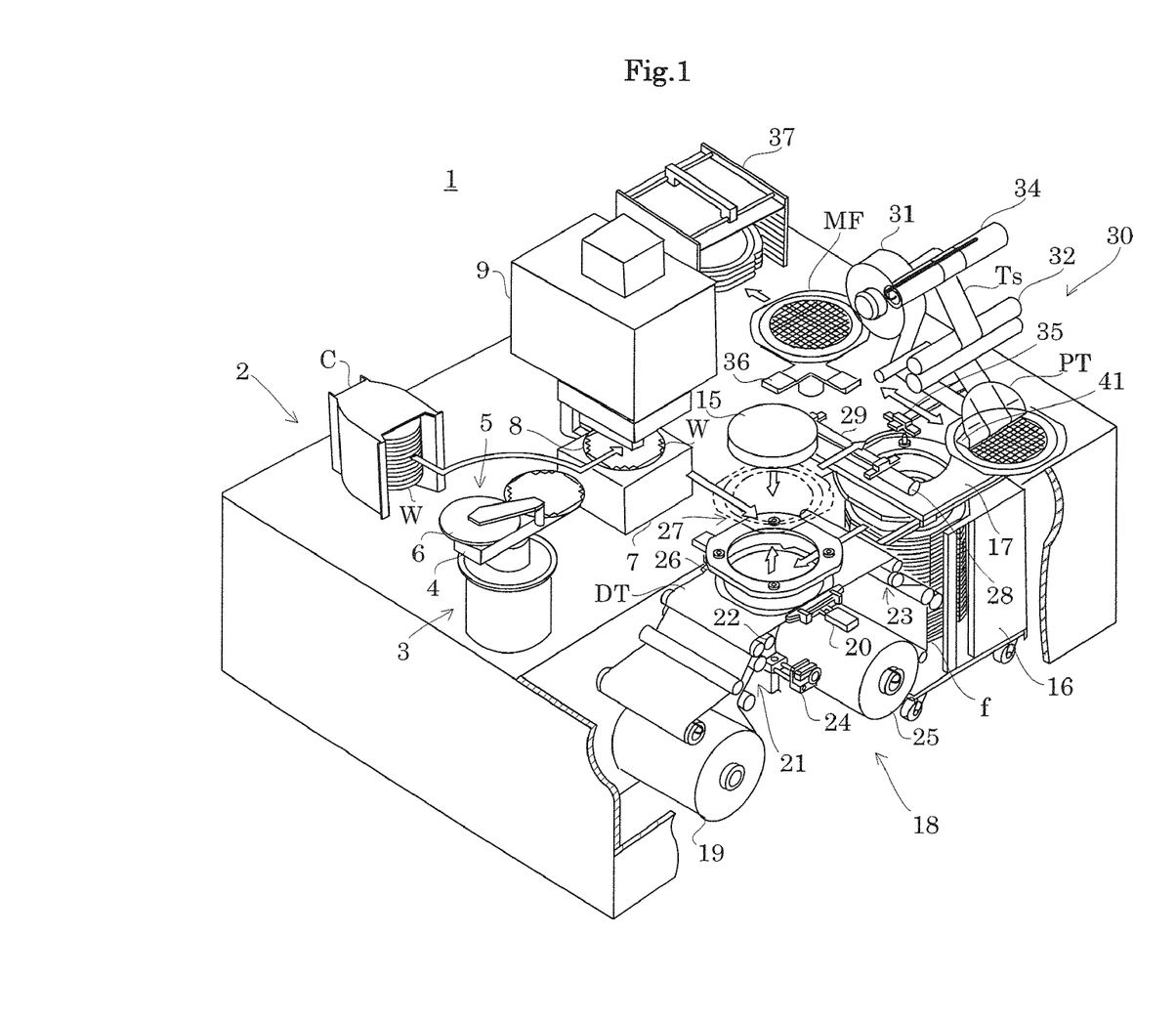
FIG. 1 is an overall perspective view of a semiconductor wafer mounting apparatus.

FIG. 1 is a partially cutaway perspective view showing an overall of a semiconductor wafer mounting apparatus in one embodiment of the invention.

The semiconductor wafer mounting apparatus 1 includes a wafer supply section 2 with cassettes C placed therein, a wafer transport mechanism 3 with a robot arm 4 and a pressing mechanism 5, an alignment stage 7, an ultraviolet irradiation device 9, a chuck table 15, a ring frame supply section 16, a ring frame transport mechanism 17, a tape processing section 18, a ring frame lifting mechanism 26, a mount frame manufacturing section 27, a first mount frame transport mechanism 29, a separating mechanism 30, a second mount frame transport mechanism 35, a turntable 36, and a mount frame collecting section 37. The wafer supply section 2 has cassettes C to house a semiconductor wafer (hereinafter, simply referred to as a "wafer W") to which a back grinding process has been performed in a stack manner. The wafer W has a surface with a protective tape joined thereto. The alignment stage 7 performs alignment of the wafer W. The ultraviolet irradiation device 9 irradiates the wafer W mounted on the alignment stage 7 with ultraviolet rays. The chuck table 15 suction holds the wafer W. The ring frame supply section 16 has a ring frame f housed therein in a stack manner. The ring frame transport mechanism 17 moves to mount the ring frame f onto an adhesive tape DT as a dicing tape. The tape processing section 18 joins the adhesive tape DT to a rear face of the ring frame f. The ring frame lifting mechanism 26 moves vertically the ring frame f with the adhesive tape DT joined thereto. The mount frame manufacturing section 27 manufactures a mount frame MF produced in one piece by joining the wafer W to the ring frame f with the adhesive tape DT joined thereto. The first mount frame transport mechanism 29 transports the manufactured mount frame MF. The separating mechanism 30 separates the protective tape PT joined to the surface of the wafer W. The second mount frame transport mechanism 35 transports the mount frame MF with the protective tape PT separated therefrom with the separation mechanism 30. The turntable 36 turns and transfers the mount frame MF. The mount frame collecting section 37 collects the mount frame MF in a stack manner.

The wafer supplying section 2 includes a cassette table. The wafer W has a pattern surface (hereinafter appropriately referred to as a "surface") with the protective tape PT joined thereto. The cassette C with the wafers W housed therein in a stack manner is placed on the cassette table. Here, each of the wafers W is kept horizontal with the pattern surface thereof directed upward.

The wafer transport mechanism 3 turns and moves vertically with a drive mechanism. Specifically, the wafer transport mechanism 3 performs positioning of a wafer holder of the robot arm 4 and a pressure plate 6 provided in the pressing mechanism 5. Moreover, the wafer transport mechanism 3 pulls out the wafer W from the cassette C, and transports the wafer W to the alignment stage 7.

The robot arm 4 of the wafer transport mechanism 3 has at its tip end a U-shaped wafer holder. The robot arm 4 is configured such that the wafer holder may move backward and forward between the wafers W housed in the cassette C in a stack manner. Here, the wafer holder at the tip end of the robot arm 4 has a vacuum suction hole to perform vacuum suction on the rear face of the wafer W.

The pressing mechanism 5 of the wafer transport mechanism 3 has at its end a circular pressure plate 6 of an approximately similar shape to the wafer W. The robot arm 4 moves backward and forward such that the pressure plate 6 moves above the wafer W placed on the alignment stage 7.

The pressing mechanism 5 operates in poor suction of the wafer W upon placing the wafer W on the holding table 8 of the alignment stage 7. Specifically, where the wafer W cannot be suction-held due to warping thereof, the pressure plate 6 presses the surface of the wafer W to correct the warping, allowing the wafer to be planar. The holding table 8 performs vacuum suction on the rear face of the wafer W under this state.

The alignment stage 7 performs alignment of the placed wafer W based on an orientation mark or a notch formed at an outer periphery of the wafer W. The alignment stage 7 includes the holding table 8 to cover the entire rear face of the wafer W for performing vacuum suction, and a motor M to turn the holding table 8.

The alignment stage 7 may move so as to transport the wafer W in a suction-held state from an initial position to an intermediate position. In the initial position, the wafer W is placed to perform alignment. The intermediate position is between the chuck table 15 and the ring frame lifting mechanism 26 above the tape processing section 18. In other words, the alignment stage 7 transports the wafer W to a subsequent process in a planar state with the warping thereof being corrected.

An ultraviolet irradiation device 9 is provided above the alignment stage 7 in the initial position. The ultraviolet irradiation device 9 irradiates with ultraviolet rays the protective tape PT, i.e., an ultraviolet curable adhesive tape joined to the surface of the wafer W. Irradiation with ultraviolet rays leads to curing of an adhesive in the protective tape, thereby reducing adhesive force thereof. See, FIGS. 2 and 3.

Figure 2:
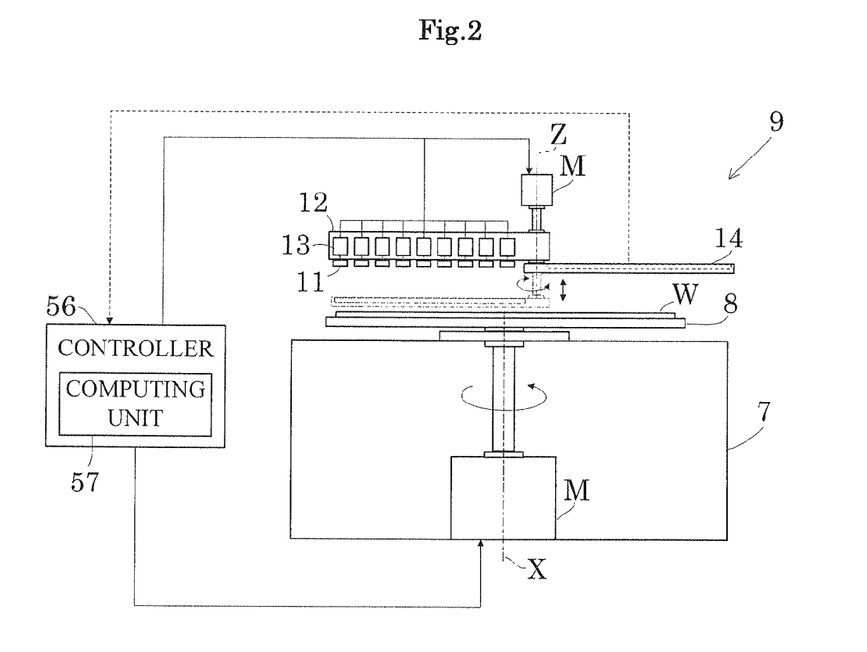
FIG. 2 is a front view of an ultraviolet irradiation device.
Figure 3:
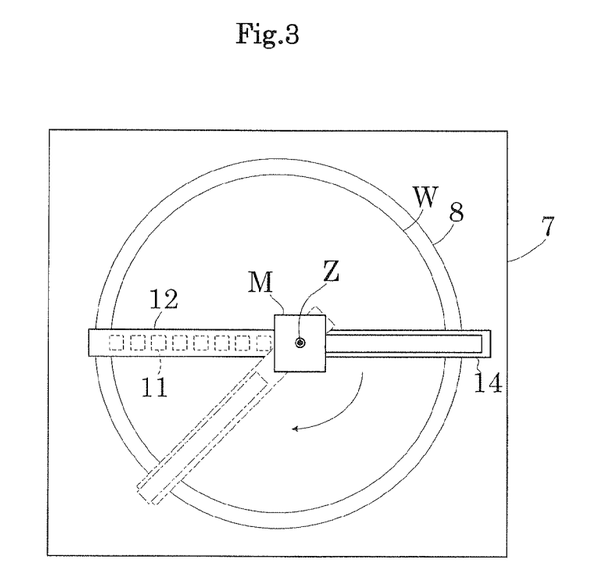
FIG. 3 is a plan view of the ultraviolet irradiation device.

Specifically, the ultraviolet ray irradiation device 9 includes an ultraviolet irradiation unit 12 and an illumination sensor 14. The ultraviolet irradiation unit 12 has ultraviolet light emitting diodes (hereinafter simply referred to as "diodes") 11 arranged at given intervals in one dimensional array along a support plate extending outwardly from a base on a center side of the alignment stage 7. The illumination sensor 14 moves to a position below the ultraviolet irradiation unit 12 to measure ultraviolet intensity.

Figure 4:
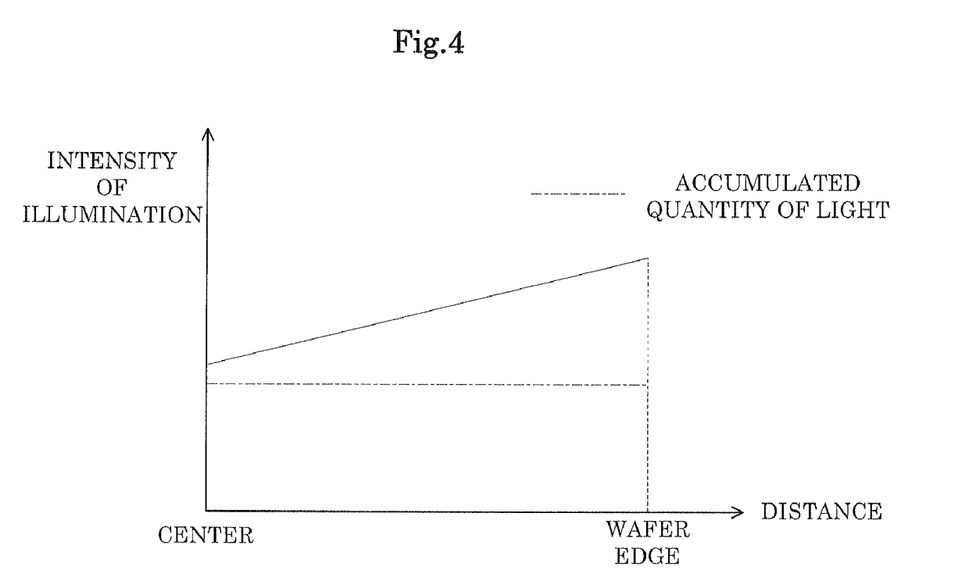
FIG. 4 shows variations in illuminance and accumulated quantity of ultraviolet light.

Each diode 11 of the ultraviolet irradiation unit 12 has a power amplifier 13. The power amplifier 13 converts ultraviolet intensity measured by the illumination sensor 14 into output voltage calculated by a computing unit 57 in a controller 56. That is, an accumulated quantity of ultraviolet light is obtained from the ultraviolet intensity and a peripheral velocity in each ultraviolet irradiation position. The peripheral velocity in a radial direction of the wafer is measured from a turning velocity of the holding table 8. The output voltage from each diode 11 is controlled such that the accumulated quantity of ultraviolet light may be maintained constant in the entire surface of the protective tape PT, as shown in FIG. 4.

The illumination sensor 14 may be formed of individual illumination sensors arranged in series or at equal intervals. Moreover, the illumination sensor 14 may be formed of a line sensor. The illumination sensor 14 has an ultraviolet receptor. The illumination sensor 14 is attached to an axis Z capable of lifting and rotating at a position slightly shifted to the right in plane from a center of the wafer such that the receptor reaches to the center thereof. That is, the illumination sensor 14 is configured to determine the ultraviolet intensity at a surface level of the wafer where the holding table 8 of the alignment stage 7 holds the wafer and turns for alignment and at a position opposite to the ultraviolet irradiation unit 12.

Turning to FIG. 1, the chuck table 15 has a circular shape approximately similar to the wafer W so as to cover the surface of the wafer W for performing vacuum suction. The chuck table 15 moves vertically from a standby position above the tape processing section 18 to a position where the wafer W is joined to the ring frame f. The chuck table 15 suction-holds the wafer W held in a planar state with the warping thereof corrected by the holding table 8.

The chuck table 15 is received in an opening of the ring frame lifting mechanism 26, to suction-hold the ring frame f with the adhesive tape DT joined to the rear face thereof. Thereafter, the wafer W moves downward to a position adjacent the adhesive tape DT joined to the underside of the ring frame f. Here, a holding mechanism, holds the chuck table 15 and ring frame lifting mechanism 26.

The ring frame supply unit 16 has a wagon shape with casters on the bottom thereof, and is housed in a body of the device. The ring frame supply unit 16 has an opening on an upper side thereof to slidingly move upward and feed out the ring frame f housed therein in a stack manner.

The ring frame transport mechanism 17 performs vacuum suction on every one ring frame f housed in the ring frame supply unit 16 in turn from the top, and transports the ring frame f to the alignment stage and the position of joining the adhesive tape DT, in turn. The ring frame transport mechanism 17 serves as a holding mechanism to hold the ring frame f in the position of joining the adhesive tape DT upon joining of the adhesive tape DT.

The tape processing section 18 includes a tape supply unit 19, a tension mechanism 20, a joining unit 21, a cutter mechanism 24, a separating unit 23, and a tape collecting section 25. The tape supply unit 19 supplies the adhesive tape DT. The tension mechanism 20 applies tension to the adhesive tape DT. The joining unit 21 joins the adhesive tape DT to the ring frame f. The cutter mechanism 24 cuts the adhesive tape DT joined to the ring frame f. The separating unit 23 separates an unnecessary tape cut with the cutter mechanism 24 from the ring frame f. The tape collecting section 25 collects remainder of the cut unnecessary tape.

The tension mechanism 20 sandwiches the adhesive tape DT on opposite ends in a width direction to apply tension to the adhesive tape DT in a tape width direction. When a soft adhesive tape DT is used, tension applied to a tape supply direction may cause occurrence of a longitudinal wrinkle on the surface of the adhesive tape DT along the tape supply direction. In order to avoid the longitudinal wrinkle so as to join the adhesive tape DT uniformly to the ring frame f, the tension mechanism 20 applies tension on the opposite ends in the tape width direction.

The joining unit 21 is placed obliquely downwardly from the ring frame f, above the adhesive tape DT, i.e., in the standby position. The joining unit 21 has a joining roller 22. The ring frame transport mechanism 17 holds to transport the ring frame f into the joining position of the adhesive tape DT. Subsequently, the tape supply unit 19 starts to supply the adhesive tape DT, and simultaneously the joining roller 22 moves to a joining start position on the right of the tape supply direction.

Subsequently, the joining roller 22 in the joining start position moves upward and rolls from the joining start position toward the standby position, thereby joining the adhesive tape DT to the ring frame f while pressing.

The separation unit 23 separates the unnecessary portion of the adhesive tape DT cut with the cutter mechanism 24 from the ring frame f. Specifically, after joining the adhesive tape DT to the ring frame f and cutting the adhesive tape DT, the tension mechanism 20 releases holding of the adhesive tape DT. Subsequently, the separation unit 23 moves toward the tape supply unit 19 on the ring frame f, thereby separating the cut unnecessary adhesive tape DT.

The cutter mechanism 24 is placed below the adhesive tape DT joined to the ring frame f. When the joining unit 21 joins the adhesive tape DT to the ring frame f, the tension mechanism 20 releases holding of the adhesive tape DT, and the cutter mechanism moves upward. The cutter mechanism 24 after moving upward cuts the adhesive tape DT along the ring frame f.

The ring frame lifting mechanism 26 is placed in the standby position above a position where the adhesive tape DT is joined to the ring frame f. After joining of the adhesive tape DT to the ring frame f, the ring frame lifting mechanism 26 moves downward to suction-hold the ring frame f. At this time, the ring frame transport mechanism 17 holding the ring frame f returns to its initial position above the ring frame supply unit 16.

After suction-holding the ring frame f, the ring frame lifting mechanism 26 moves upward to a position of joining the wafer W. At this time, the chuck table 15 holding the wafer W also moves downward to the position of joining the wafer W.

The mount frame manufacturing section 27 has a joining roller 28 with an outer peripheral surface that is elastically deformable. The joining roller 28 rolls on a non-adhesive surface of the adhesive tape DT joined to the rear face of the ring frame f while pressing.

The first mount frame transport mechanism 29 performs vacuum suction on the mount frame MF that the ring frame f is formed in one piece with the wafer W, and moves to mount the mount frame MF onto the separation mechanism 30.

Figure 5:
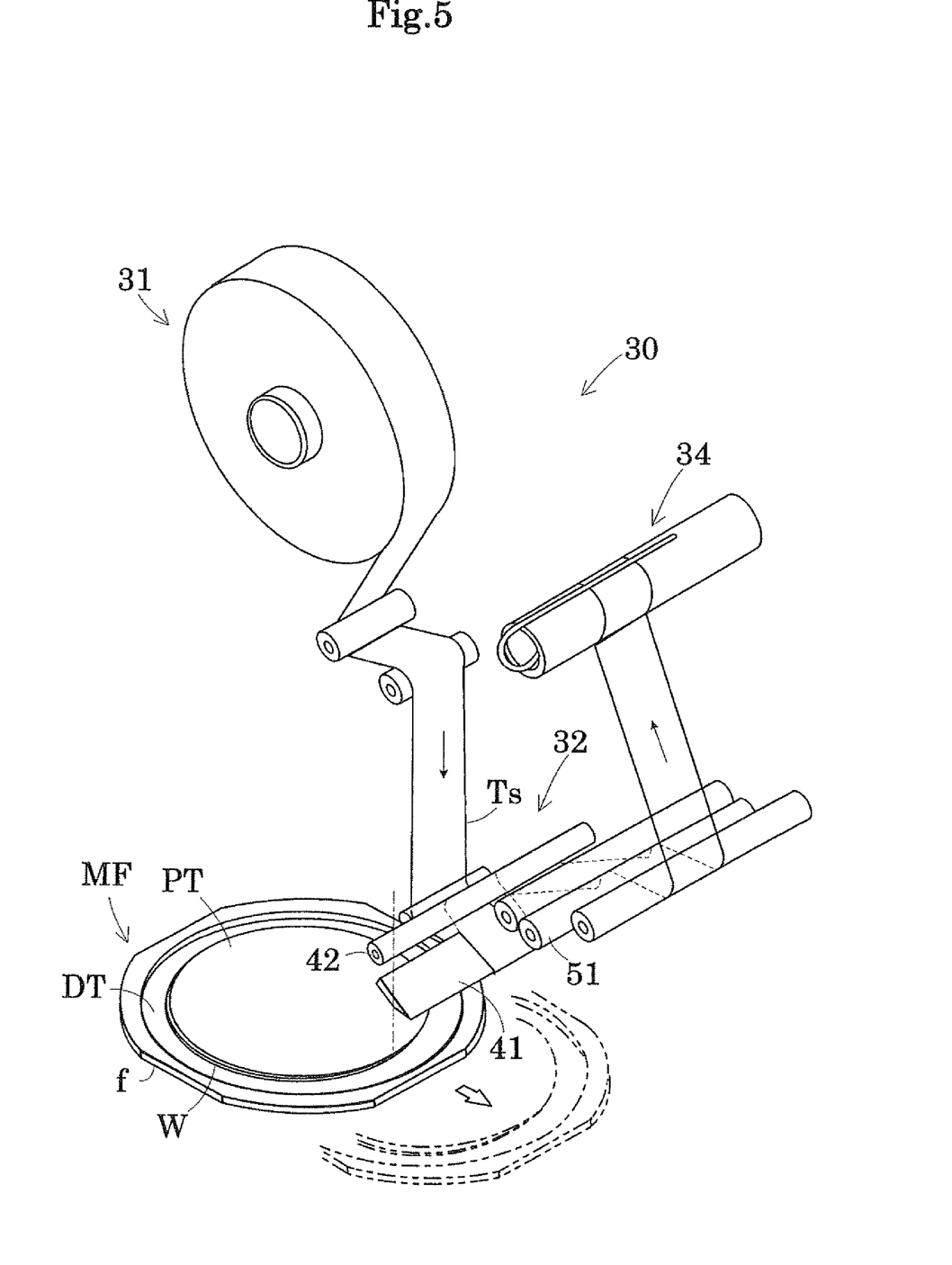
FIG. 5 is a perspective view showing operation of a separation mechanism.

The separating mechanism 30 includes a separation table, a tape supply section 31, a separating unit 32, and a tape collecting section 34. The separation table moves the wafer W mounted thereon. The tape supply section 31 supplies a separation tape Ts. The separation unit 32 joins and separates the separation tape Ts. The tape collecting section 34 collects the separated separation tape Ts and the protective tape PT.

As shown in FIG. 5, the tape supplying unit 31 guides and supplies the separation tape Ts fed out from the original master roll to a lower side of the separation unit 32. The tape collecting section 34 guides upward the separation tape Ts fed out from the separation unit 32 so as to wind up and collect the separation tape Ts.

The separation unit 32 has a sharp edge 41 and a guide roller 42. The edge 41 serves as joining and separating members of the separation tape Ts. The guide roller 42 guides the separation tape Ts folded back at a tip end of the edge 41 toward the tape collecting section 34.

Turning to FIG. 1, the second mount frame transport mechanism 35 performs vacuum suction on the mount frame MF fed out from the separating mechanism 30, and moves to mount the mount frame MF onto a turntable 36.

The turntable 36 aligns the mount frame MF, and houses the mount frame MF in the mount frame collecting section 37. Specifically, the second mount frames transport mechanism 35 places the mount frame MF on the turntable 36, and then the turntable 36 aligns the mount frame MF based on an orientation mark of the wafer W or a positioning contour of the ring frame f. The turntable 36 turns so as to change a direction in which the mount frame MF is housed in the mount frame collecting section 37. When the direction for housing the mount frame MF is fixed, the turntable 36 pushes out the mount frame MF with a pusher to house the mount frame MF in the mount frame collecting section 37.

The mount frame collecting section 37 is placed on a mount table capable of moving vertically. Specifically, moving vertically of the mount table allows the mount frame MF pushed out with the pusher to be housed on any sections in the mount frame collecting section 37.

Description will be made hereinafter of a round of operation about the above apparatus according to one embodiment.

Firstly, settings of each mechanism in the semiconductor wafer mounting apparatus 1 are inputted into the controller 56 via an operating panel. For instance, a type of protective tape PT is inputted. Upon input of the type of protective tape PT, the controller 56 reads out a corresponding accumulated quantity of ultraviolet light databased in advance from a memory therein. Simultaneously, a drive mechanism operates to move the illumination sensor 14 to a position of measurement.

When movement of the illumination sensor 14 is completed, the ultraviolet irradiation unit 12 operates to perform an initial measurement while the holding table 8 turns. The result of the measurement detected by the illumination sensor 14 facing to each of the diodes 11 is transmitted to the controller 56. The computing unit 57 in the controller 56 determines a peripheral velocity at an opposite position to the diodes 11 arranged radically in a line in accordance with the turning velocity of the holding table 8 set in advance. Subsequently, output voltage is determined for every power amplifier 13 of the diodes 11 when an accumulated quantity of ultraviolet light in the protective tape PT in each irradiation position is constant and the adhesive of the protective tape PT is curable in a shortest duration. After completing the measurement, the illumination sensor 14 returns to its upper standby position apart from the determination area.

Upon fixing of ultraviolet irradiation conditions, the robot arm 4 operates so that the wafer holder is inserted between the stacked wafers W in the cassette C. The wafer W is suction-held on the rear face thereof, and pulled out for every one wafer. The pulled out wafer W is transported to the alignment stage 7.

The robot arm 4 places the wafer W on the holding table 8 to suction-hold the rear face of the wafer W. In this state, a pressure gauge, measures a level where the wafer W is suction-held. A comparison is made of the measurement result and the predetermined reference value in relation to a pressure value in a normal operation.

When poor suction holding is detected from the result of the comparison, the pressure plate 6 presses a surface of the wafer W. Consequently, the wafer W in a planar state with corrected warping may be suction-held. In addition, the wafer W is aligned based on the orientation mark or the notch.

The ultraviolet irradiation unit 12 provided with the diodes 11 each having individually different output irradiates the protective tape PT with ultraviolet rays when the holding table 8 turns for detection of the orientation mark or notch of the wafer W. Although irradiation intensity differs for every ultraviolet irradiation area on the protective tape PT, the accumulated quantity of light of ultraviolet light is maintained constant in the entire irradiation area, thereby uniformly reducing the adhesive force of the adhesive.

The wafer W is aligned on the alignment stage 7 and subjected to an irradiation treatment of ultraviolet rays, and thereafter is transported, along with the alignment stage 7, to the mount frame manufacturing unit 27 at a subsequent step while being suction-held on the holding table 8. That is, the alignment stage 7 moves to an intermediate position between the chuck table 15 and the ring frame lifting mechanism 26.

When the alignment stage 7 is set standby in a predetermined position, the chuck table 15 located above the alignment stage 7 moves downward to contact a bottom face thereof with the wafer W, thereby starting vacuum suction. When the chuck table 15 starts vacuum suction, the holding table 8 releases its suction holding of the wafer W. The chuck table 15 receives the wafer W in a planar state with the warping thereof corrected by the holding table 8. After transporting the wafer W, the alignment stage 7 returns to its initial position.

Next, the ring frame transport mechanism 17 performs vacuum suction on every ring frame f from the top that is housed in the ring frame supply section 16 in a stack manner, and then pulls out the ring frame f. The pulled-out ring frame f is aligned on an alignment stage, and then transported to a tape joining position above the adhesive tape DT.

The ring frame transport mechanism 17 holds the ring frame f and moves the ring frame f into the joining position of the adhesive tape DT, and then a tape supply section 19 starts to supply the adhesive tape DT. Simultaneously, the joining roller 22 moves into a joining start position.

When the joining roller 22 reaches into the joining start position, the tension mechanism 20 holds the opposite ends of the adhesive tape DT in the tape width direction, thereby applying tension to the adhesive tape DT in the tape width direction.

Next, the joining roller 22 moves upward to press and join the adhesive tape DT onto the end of the ring frame f. After joining the adhesive tape DT to the end of the ring frame f, the joining roller 22 rolls toward the tape supply section 19, i.e., to a standby position. Here, the joining roller 22 rolls while pressing the non-adhesive surface of the adhesive tape DT, thereby joining the adhesive tape DT to the ring frame f. When the joining roller 22 reaches at its joining termination position, the tension mechanism 20 releases holding of the adhesive tape DT.

Simultaneously, the cutter mechanism 24 moves upward to cut the adhesive tape DT along the ring frame f. Upon completion of cutting the adhesive tape DT, the separation unit 23 moves toward the tape supply section 19, thereby separating the unnecessary adhesive tape DT.

Subsequently, the tape supply section 19 operates to feed out the adhesive tape DT while feeding out the unnecessary tape to the tape collecting section 25. In this state, the joining roller 22 moves into the joining start position so as to join the adhesive tape DT to another ring frame f.

The ring frame lifting mechanism 26 moves upward while suction holding a frame portion of the ring frame f with the adhesive tape DT joined thereto. Here, the chuck table 15 also moves downward. That is, the chuck table 15 and the ring frame lifting mechanism 26 each move into the joining position of the wafer W.

Upon reaching at a predetermined position, each of the chuck table 15 and the ring frame lifting mechanism 26 is held with a holding mechanism. Next, the joining roller 28 moves into a joining start position of the adhesive tape DT. The joining roller 28 rolls while pressing the non-adhesive surface of the adhesive tape DT joined to the rear face of the ring frame f, thereby joining the adhesive tape DT to the wafer W. Consequently, the mount frame MF may be manufactured that the ring frame f and the wafer W are formed in one piece.

After manufacturing of the mount frame MF, the chuck table 15 and the ring frame lifting mechanism 26 move upward. The holding table also moves below the mount frame MF and places the mount frame MF thereon. The first mount frame transport mechanism 29 suction-holds the placed mount frame MF, and moves to place the mount frame MF onto the separation table.

The separation table with the mount frame MF placed thereon moves forward below the separation unit 32. In this process, a pulse motor controls a position of the separation table at the time when a light sensor detects a front edge of the protective tape PT such that the separation table moves forward from the detected position by a distance determined in advance from the light sensor to the edge member 41. Here, the separation table once stops forward movement. Specifically, the separation table once stops forward movement automatically upon reaching of the front edge of the protective tape PT at a position below the tip end of the edge member 41.

Once the separation table stops, the pulse motor operates to control the movable table to move downward such that the edge member 41 moves downward with the separation tape Ts supplied from the tape supply unit 31 being wounded thereon. That is, the separation tape Ts is joined to the front end surface of the protective tape PT at a given pressure while being pushed with the tip end of the edge member 41.

When joining of the separation tape Ts to the front end of the protective tape PT is completed, the separation table starts forward movement again while the edge member 41 presses the separation tape Ts against the protective tape PT. Moreover, the separation tape Ts is wound up to the tape collecting section 34 at a speed synchronized to a traveling velocity of the mount frame MF. In this way, the edge member 41 joins the separation tape Ts to the protective tape PT on the surface of the wafer W while pressing. Simultaneously, the edge member 41 separates the protective tape PT from the surface of the wafer W together with the joined separation tape Ts while separating the separation tape Ts.

The pulse motor operates to control the edge member 41 so as to move by a distance corresponding to a diameter of the wafer from a separation tape joining position where the edge member 41 moves downward. Specifically, when the edge member 41 reaches into the rear edge of the protective tape PT and completely separates the protective tape PT from the surface of the wafer W, the edge member 41 moves upward and the separation unit 32 returns to its initial state.

After the protective tape PT is separated from the mount frame MF, the separation table moves the mount frame MF to the standby position of the second mount frame transport mechanism 35.

Subsequently, the second mount frame transport mechanism 35 moves to place the mount frame MF fed out from the separation mechanism 30 onto the turntable 36. The placed mount frame MF is aligned using the orientation mark or the notch, and a direction of the mount frame MF to be housed is adjusted. After performing alignment of the mount frame MF and determination in the direction thereof to be housed, a pusher pushes out to house the mount frame MF in the mount frame collecting section 37.

As mentioned above, the diodes 11 are arranged outwardly from the center side of the wafer W in one-dimensional array, output voltage of each diode 11 increases outwardly from the center side of the wafer W, and the output voltage of each diode 11 is controlled in accordance with the peripheral velocity. Consequently, an accumulate quantity of light in the entire surface of the protective tape that is irradiated with ultraviolet rays may be maintained constant. Therefore, remainder of the adhesive on the surface of the wafer surface may be eliminated that occurs from poor curing of the adhesive upon separating of the protective tape PT.

Moreover, the diodes 11 need not to be arranged in row and columns beyond the diameter of the wafer W, and the holding table 8 only need to turn in a predetermined position. Thus, the configuration of the apparatus may be reduced in size.

This invention is not limited to the foregoing embodiments, but may be modified as follows.

In the exemplary embodiment described above, the output voltage of each diode 11 is controlled using the illumination sensor 14 prior to operation of the semiconductor wafer mounting apparatus 1. The ultraviolet intensity to an appropriate number or all of the wafers W subject to treatment may be measured before alignment, and the output voltage of each diode 11 may be controlled.

In the exemplary embodiment described above, the ultraviolet irradiation unit 12 and illumination sensor 14 are formed in one piece. The ultraviolet irradiation unit 12 and illumination sensor 14 may be separately formed.

In the exemplary embodiment described above, an accumulate quantity of ultraviolet light is maintained constant by control of the output voltage of the diodes 11 while fixing the distance from the surface of protective tape PT to each diode 11. The distance from the surface of protective tape PT to each diode 11 may be controlled while fixing the output voltage of the diodes 11.

Figure 6:
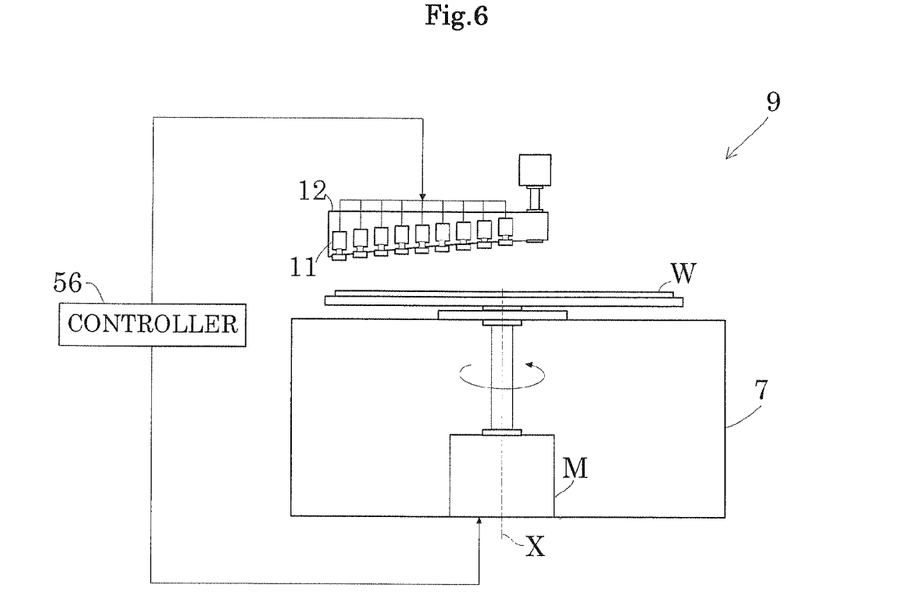
FIGS. 6 to 8 are front views each showing another ultraviolet irradiation device.

The peripheral velocity increases outwardly from the center of the wafer W. Therefore, in order to obtain the same accumulate quantity of ultraviolet light between the outside portion and the center side of the wafer W, a distance from the surface of the protective tape PT to the diodes 11 may decrease outwardly from the center of the wafer, as shown in FIG. 6.

Figure 7:
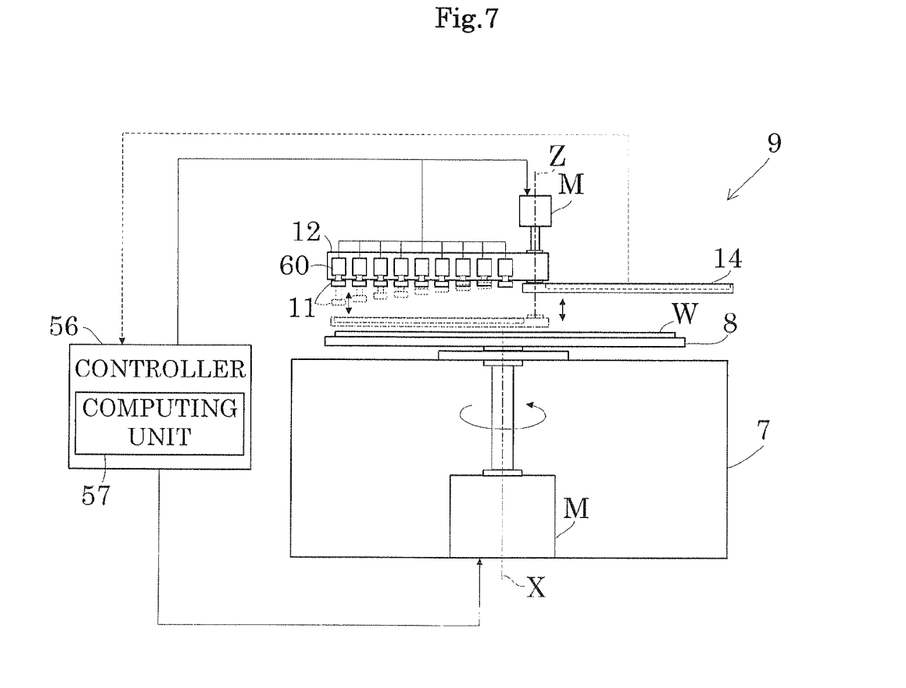

In another exemplary embodiment, actuators 60 control to change the level of each diode 11, as shown in FIG. 7. In this configuration, the illumination sensor 14 is moved to a position of measurement, the output of each diode is fixed, and then ultraviolet rays are applied. Here, the level of each diode 11 is determined upon measurement of the ultraviolet intensity where the accumulate quantity of light obtained from turning of the holding table 8 and the ultraviolet intensity is maintained constant in the entire irradiation areas. Each actuator 60 operates in accordance with the result of measurement to move each diode 11 to a given level. This configuration may produce the same effect as in the exemplary embodiments described above.

Figure 8:
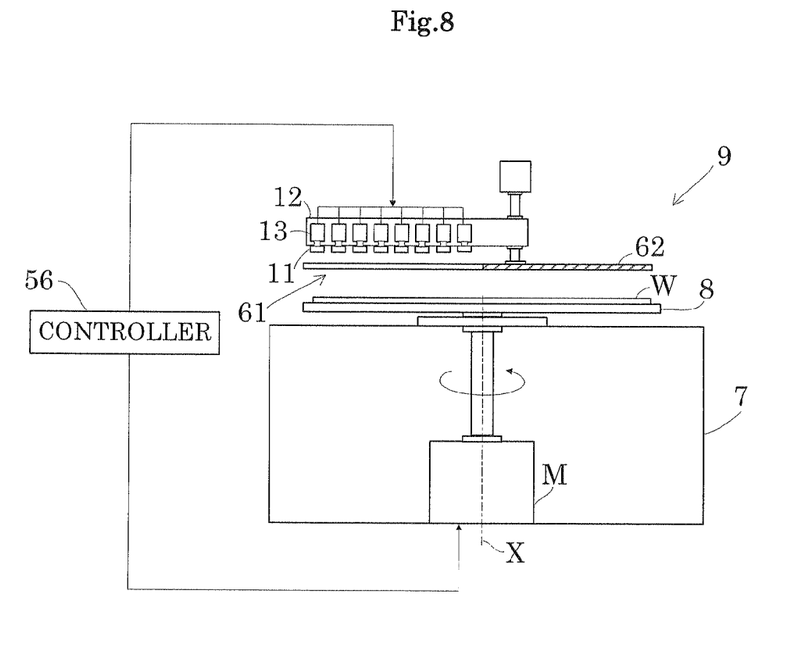
Figure 9:
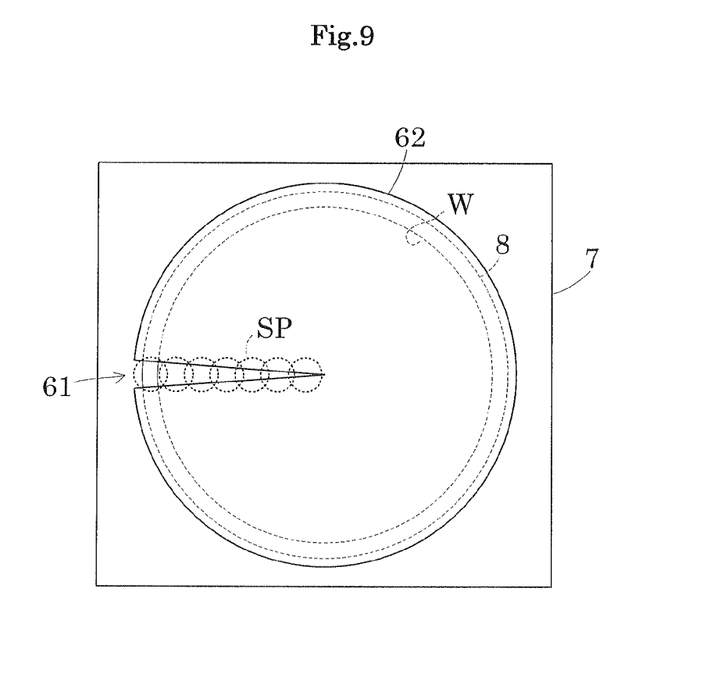
FIG. 9 is a schematic view showing irradiation with ultraviolet rays through a slit of a screen.

In each of the exemplary embodiments described above, a screen 62 may be arranged between the ultraviolet irradiation unit 12 and wafer W. As shown in FIGS. 8 and 9, the screen 62 has a fan-shaped slit 61 formed therein that spreads outwardly from the center of the wafer W.

According to this configuration, the slit has a lower peripheral turning velocity and a smaller opening area in the center side of the wafer W, leading to ultraviolet light with a reduced diameter of the spot SP. On the other hand, the slit has a higher peripheral turning velocity and a larger opening area toward the periphery of the wafer W. Consequently, a constant accumulated quantity of light may be realized in the entire area of the protective tape PT where ultraviolet rays are applied.

Figure 10:
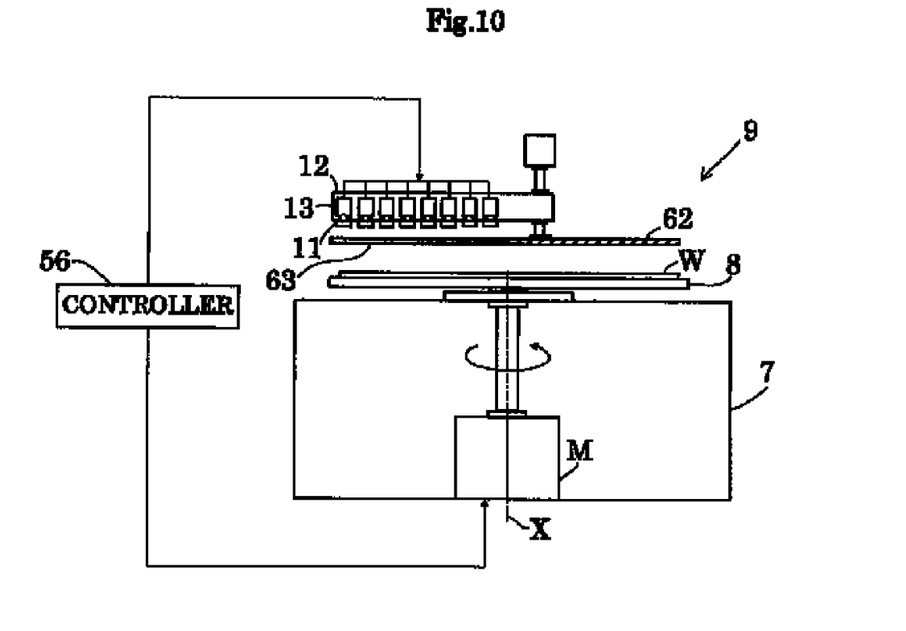
FIGS. 10 to 12 are front views each showing another ultraviolet irradiation device.

As shown in FIG. 10, a filter 63 may be arranged between the ultraviolet irradiation unit 12 and the holding table 8 in which ultraviolet transmittance thereof increases outwardly from the center of the wafer W. For instance, only the filter 63 may be arranged. Moreover, the filter 63 may be provided according to the slit 61 of the screen 62 in the above exemplary embodiment.

Figure 11:
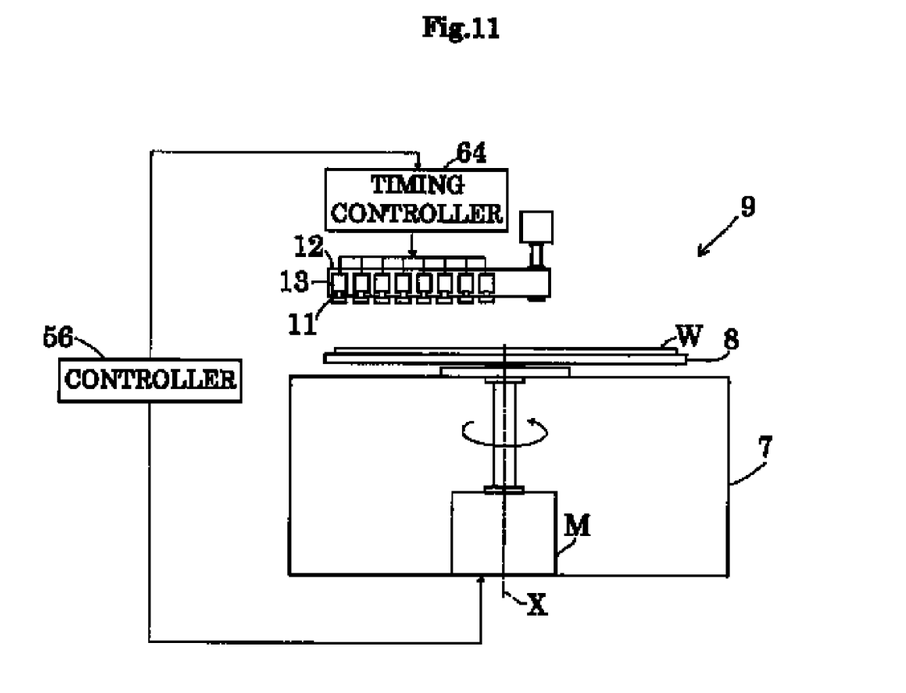

As shown in FIG. 11, a timing controller 64 may control timing for switching of the power amplifier 13 in each diode 11 to maintain a constant accumulated quantity of light in the entire area of the protective tape PT where ultraviolet rays are applied. Specifically, lighting duration of the diodes 11 may be controlled so as to extend outwardly of the wafer W compared to the center of the wafer W having a lower peripheral turning velocity.

Figure 12:
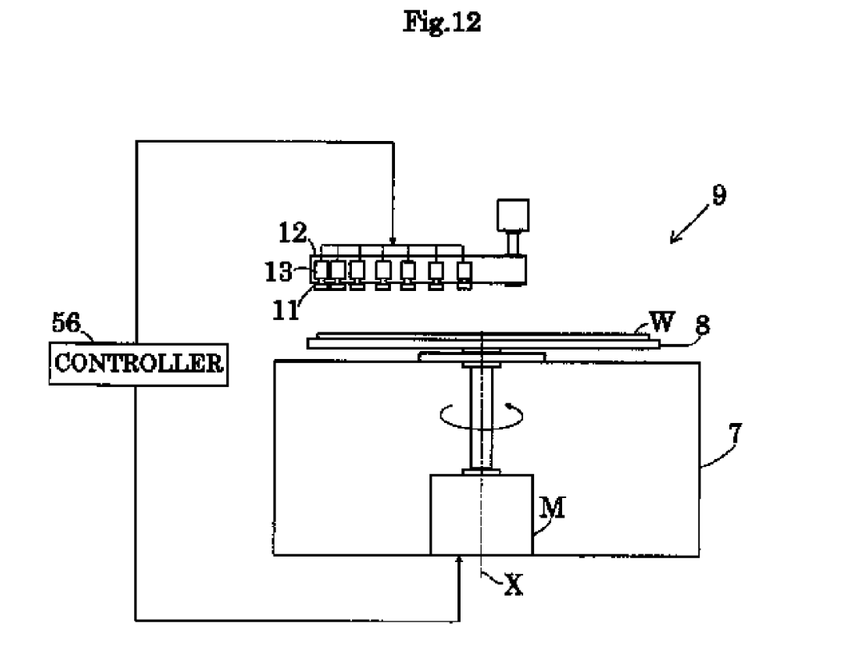

The diodes 11 may be arranged such that the spaces therebetween may be smaller outwardly from the center of the wafer W. Specifically, as shown in FIG. 12, smaller spaces between the diodes 11 on the outside portion pf the wafer having a higher turning velocity may lead to overlapping of the radial ultraviolet spots, thereby realizing increased ultraviolet intensity.

Moreover, the actuator connected to every diode 11 or an individual drive mechanism may move each diode 11 radically along a guide rail. With this configuration, the spaces between the diodes may vary optionally and the diodes may operate effectively upon changing the wafer W in size.

Figure 13:
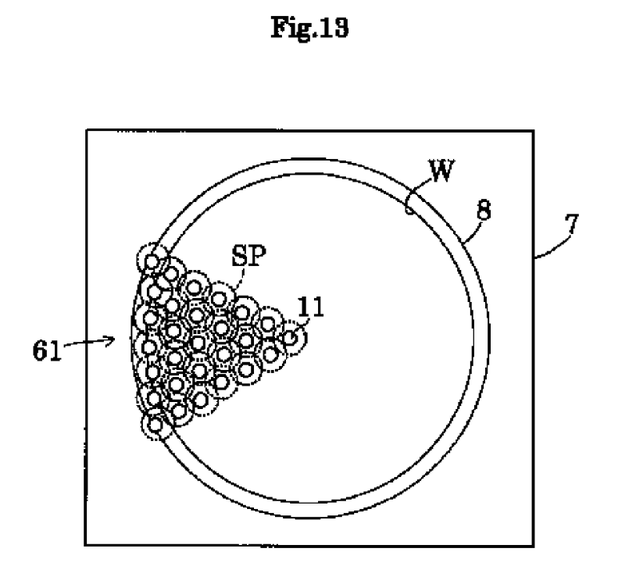
FIG. 13 is a plan view showing diodes of another ultraviolet irradiation device.

The foregoing exemplary embodiments have been described by taking the ultraviolet irradiation unit 12 having the diodes 11 arranged in one-dimensional array as an example. The ultraviolet irradiation unit 12 may be configured as follows. Specifically, as shown in FIG. 13, the ultraviolet irradiation unit 12 of each exemplary embodiment described above may have the diodes 11 arranged in a fan shape.

Figure 14:
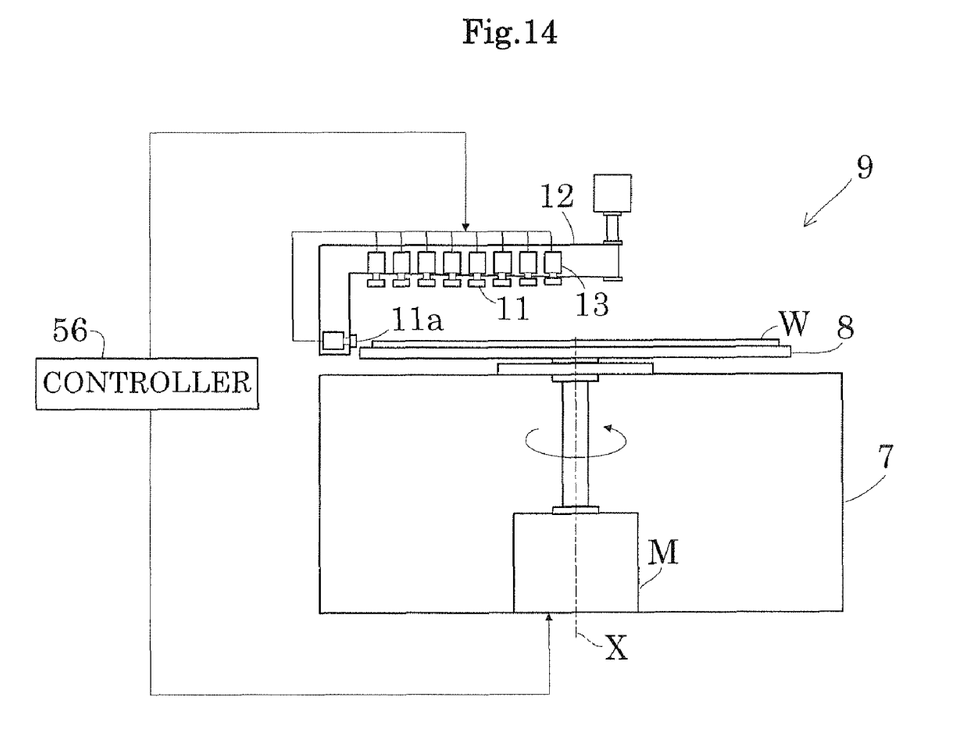
FIG. 14 is a front view showing another ultraviolet irradiation device.

In each exemplary embodiment described above, the diodes 11 are arranged above the wafer W. The diodes 11 may be arranged as follows. Specifically, as shown in FIG. 14, a diode 11a may be arranged for applying ultraviolet rays to the edge of the wafer W. For instance, when ultraviolet rays are applied while nitrogen is purged into a chamber with the whole alignment stage 7 housed therein, the ultraviolet irradiation unit 12 may irradiate the edge of the wafer with ultraviolet rays from the diode 11a at an approximately identical output to that of the diode 11 on the outermost periphery side of the wafer W.

Where the ultraviolet irradiation unit 12 applies ultraviolet rays while being open to the atmosphere with no nitrogen being purged, oxygen in the atmosphere prevents the adhesive from being cured. Thus, the ultraviolet irradiation unit 12 controls so as to apply ultraviolet rays having higher intensity than that on the surface of the wafer W.

With this configuration, all the adhesives may be cured uniformly and the adhesive force thereof may be reduced. Consequently, suppression may be made of damages on the wafer due to an uncured adhesive on the wafer edge and residues of the adhesive on the wafer edge upon separation of the protective tape in a subsequent process.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An ultraviolet irradiation device for irradiating with ultraviolet rays an ultraviolet curable protective tape joined to a surface of a semiconductor wafer, comprising:
   a holding table to mount and hold the semiconductor wafer with the protective tape joined thereto;
   a drive mechanism to turn the holding table;
   ultraviolet light emitting diodes arranged at least in a radial direction of the semiconductor wafer; and
   a control unit to maintain a uniform accumulated quantity of light in an area of the protective tape where ultraviolet rays are applied upon irradiation of a surface of the protective tape with ultraviolet rays from the ultraviolet light emitting diodes while turning the holding table that places and mounts the semiconductor wafer with the protective tape joined thereto,
   wherein supply voltage is controlled such that ultraviolet intensity from the ultraviolet light emitting diodes increases outwardly of the semiconductor wafer.

2. The ultraviolet irradiation device according to claim 1, further comprising:
   an amplifier to amplify the supply voltage to the ultraviolet light emitting diodes; and
   a controller to control the amplifier.

3. An ultraviolet irradiation device for irradiating with ultraviolet rays an ultraviolet curable protective tape joined to a surface of a semiconductor wafer, comprising:
   a holding table to mount and hold the semiconductor wafer with the protective tape joined thereto;
   a drive mechanism to turn the holding table;
   ultraviolet light emitting diodes arranged at least in a radial direction of the semiconductor wafer; and
   a control unit to maintain a uniform accumulated quantity of light in an area of the protective tape where ultraviolet rays are applied upon irradiation of a surface of the protective tape with ultraviolet rays from the ultraviolet light emitting diodes while turning the holding table that places and mounts the semiconductor wafer with the protective tape joined thereto,
   wherein a distance from the surface of the protective tape to the ultraviolet light emitting diodes decreases outwardly of the semiconductor wafer.

4. The ultraviolet irradiation device according to claim 3, further comprising:
   a sensor to measure intensity of ultraviolet rays from the ultraviolet light emitting diodes;
   a lifting mechanism to change each level of the ultraviolet light emitting diodes; and
   a level controller to control each level of the ultraviolet light emitting diodes based on detected result of the sensor through operation of the lifting mechanism so as to maintain a uniform accumulated quantity of light per area on the surface of the protective tape.

5. The ultraviolet irradiation device according to claim 4, further comprising:
   a drive mechanism to move the sensor between a position where the ultraviolet light emitting diodes apply ultraviolet rays and a position where the ultraviolet light emitting diodes apply no ultraviolet rays.

6. An ultraviolet irradiation device for irradiating with ultraviolet rays an ultraviolet curable protective tape joined to a surface of a semiconductor wafer, comprising:
   a holding table to mount and hold the semiconductor wafer with the protective tape joined thereto;
   a drive mechanism to turn the holding table;
   ultraviolet light emitting diodes arranged at least in a radial direction of the semiconductor wafer; and
   a control unit to maintain a uniform accumulated quantity of light in an area of the protective tape where ultraviolet rays are applied upon irradiation of a surface of the protective tape with ultraviolet rays from the ultraviolet light emitting diodes while turning the holding table that places and mounts the semiconductor wafer with the protective tape joined thereto,
   wherein spaces between the ultraviolet light emitting diodes are smaller outwardly of the semiconductor wafer.

7. The ultraviolet irradiation device according to claim 6, further comprising:
   a drive mechanism to move the ultraviolet light emitting diodes separately in a horizontal direction; and
   a controller to adjust the spaces between the ultraviolet light emitting diodes by control of the drive mechanism.

8. An ultraviolet irradiation device for irradiating with ultraviolet rays an ultraviolet curable protective tape joined to a surface of a semiconductor wafer, comprising:
   a holding table to mount and hold the semiconductor wafer with the protective tape joined thereto;
   a drive mechanism to turn the holding table;
   ultraviolet light emitting diodes arranged at least in a radial direction of the semiconductor wafer;
   a control unit to maintain a uniform accumulated quantity of light in an area of the protective tape where ultraviolet rays are applied upon irradiation of a surface of the protective tape with ultraviolet rays from the ultraviolet light emitting diodes while turning the holding table that places and mounts the semiconductor wafer with the protective tape joined thereto; and
   a lighting control unit to control intermittent lighting of each ultraviolet light emitting diode so as to extend a lighting duration of each ultraviolet light emitting diode outwardly of the semiconductor wafer.

9. An ultraviolet irradiation device for irradiating with ultraviolet rays an ultraviolet curable protective tape joined to a surface of a semiconductor wafer, comprising:
   a holding table to mount and hold the semiconductor wafer with the protective tape joined thereto;
   a drive mechanism to turn the holding table;
   ultraviolet light emitting diodes arranged at least in a radial direction of the semiconductor wafer;
   a control unit to maintain a uniform accumulated quantity of light in an area of the protective tape where ultraviolet rays are applied upon irradiation of a surface of the protective tape with ultraviolet rays from the ultraviolet light emitting diodes while turning the holding table that places and mounts the semiconductor wafer with the protective tape joined thereto; and
   a screen that is interposed between the semiconductor wafer and the ultraviolet light emitting diodes and has a slit formed therein that fans outwardly from the center of the semiconductor wafer.

10. An ultraviolet irradiation device for irradiating with ultraviolet rays an ultraviolet curable protective tape joined to a surface of a semiconductor wafer, comprising:
   a holding table to mount and hold the semiconductor wafer with the protective tape joined thereto;
   a drive mechanism to turn the holding table;
   ultraviolet light emitting diodes arranged at least in a radial direction of the semiconductor wafer;
   a control unit to maintain a uniform accumulated quantity of light in an area of the protective tape where ultraviolet rays are applied upon irradiation of a surface of the protective tape with ultraviolet rays from the ultraviolet light emitting diodes while turning the holding table that places and mounts the semiconductor wafer with the protective tape joined thereto; and a filter that is interposed between the semiconductor wafer and the ultraviolet light emitting diodes and has increased ultraviolet transmittance outwardly of the semiconductor wafer.

11. An ultraviolet irradiation device for irradiating with ultraviolet rays an ultraviolet curable protective tape joined to a surface of a semiconductor wafer, comprising:

a holding table to mount and hold the semiconductor wafer with the protective tape joined thereto;

a drive mechanism to turn the holding table;

ultraviolet light emitting diodes arranged at least in a radial direction of the semiconductor wafer;

a control unit to maintain a uniform accumulated quantity of light in an area of the protective tape where ultraviolet rays are applied upon irradiation of a surface of the protective tape with ultraviolet rays from the ultraviolet light emitting diodes while turning the holding table that places and mounts the semiconductor wafer with the protective tape joined thereto; and an auxiliary ultraviolet light emitting diode arranged at a site located at an outer periphery of the semiconductor wafer to apply an ultraviolet ray towards a peripheral edge of the protective tape.

* * * * *